(12) United States Patent
Makabe

(10) Patent No.: US 11,742,250 B2
(45) Date of Patent: Aug. 29, 2023

(54) TEST CIRCUIT FOR DETECTING PARASITIC CAPACITANCE OF TSV

(71) Applicant: MICRON TECHNOLOGY, INC., Boise, ID (US)

(72) Inventor: Harutaka Makabe, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 459 days.

(21) Appl. No.: 16/996,565

(22) Filed: Aug. 18, 2020

(65) Prior Publication Data

US 2022/0059418 A1 Feb. 24, 2022

(51) Int. Cl.
*H01L 21/66* (2006.01)
*H01L 23/48* (2006.01)
*H01L 25/065* (2023.01)
*G01R 27/26* (2006.01)

(52) U.S. Cl.
CPC .......... *H01L 22/34* (2013.01); *G01R 27/2605* (2013.01); *H01L 23/481* (2013.01); *H01L 25/0657* (2013.01); *H01L 2225/06513* (2013.01); *H01L 2225/06541* (2013.01); *H01L 2225/06596* (2013.01)

(58) Field of Classification Search
CPC ........ H01L 23/49827; H01L 21/76898; G01R 31/318513
See application file for complete search history.

(56) References Cited

U.S. PATENT DOCUMENTS

| | | | |
|---|---|---|---|
| 7,566,960 B1 * | 7/2009 | Conn | H01L 23/49822 257/E23.079 |
| 2013/0002272 A1 * | 1/2013 | Badaroglu | G01R 31/31717 324/750.01 |
| 2015/0340069 A1 * | 11/2015 | Arai | G11C 29/021 326/30 |
| 2017/0316834 A1 * | 11/2017 | Huynh | G11C 16/3422 |
| 2021/0050200 A1 * | 2/2021 | Song | H03F 3/087 |
| 2021/0091058 A1 * | 3/2021 | Makabe | H01L 22/22 |

* cited by examiner

*Primary Examiner* — Jermele M Hollington
*Assistant Examiner* — Temilade S Rhodes-Vivour
(74) *Attorney, Agent, or Firm* — Dorsey & Whitney LLP

(57) ABSTRACT

Disclosed herein is an apparatus that includes a first semiconductor chip, and a first TSV penetrating the first semiconductor chip. The first semiconductor chip includes a first resistor coupled between a first power supply and a first node, a switch circuit coupled between the first node and the first TSV, a pad electrode operatively coupled to the first node, and a constant current source operatively coupled to either one of the first node and the pad electrode.

20 Claims, 8 Drawing Sheets

TEST CIRCUIT FOR DETECTING PARASITIC CAPACITANCE OF TSV

BACKGROUND

A semiconductor chip used in a memory device such as an HBM (High Bandwidth Memory) includes many TSVs (Through Silicon Vias) provided to penetrate a semiconductor substrate in some cases. The TSVs provided on each semiconductor chip are respectively connected to TSVs provided on another semiconductor chip and located at same planar locations with microbumps, whereby signal paths penetrating a plurality of semiconductor substrates are formed. Because the signal quality of a signal transmitted through TSVs varies according to parasitic capacitances of the TSVs, a method of accurately measuring the parasitic capacitances of the TSVs has been demanded.

DETAILED DESCRIPTION various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
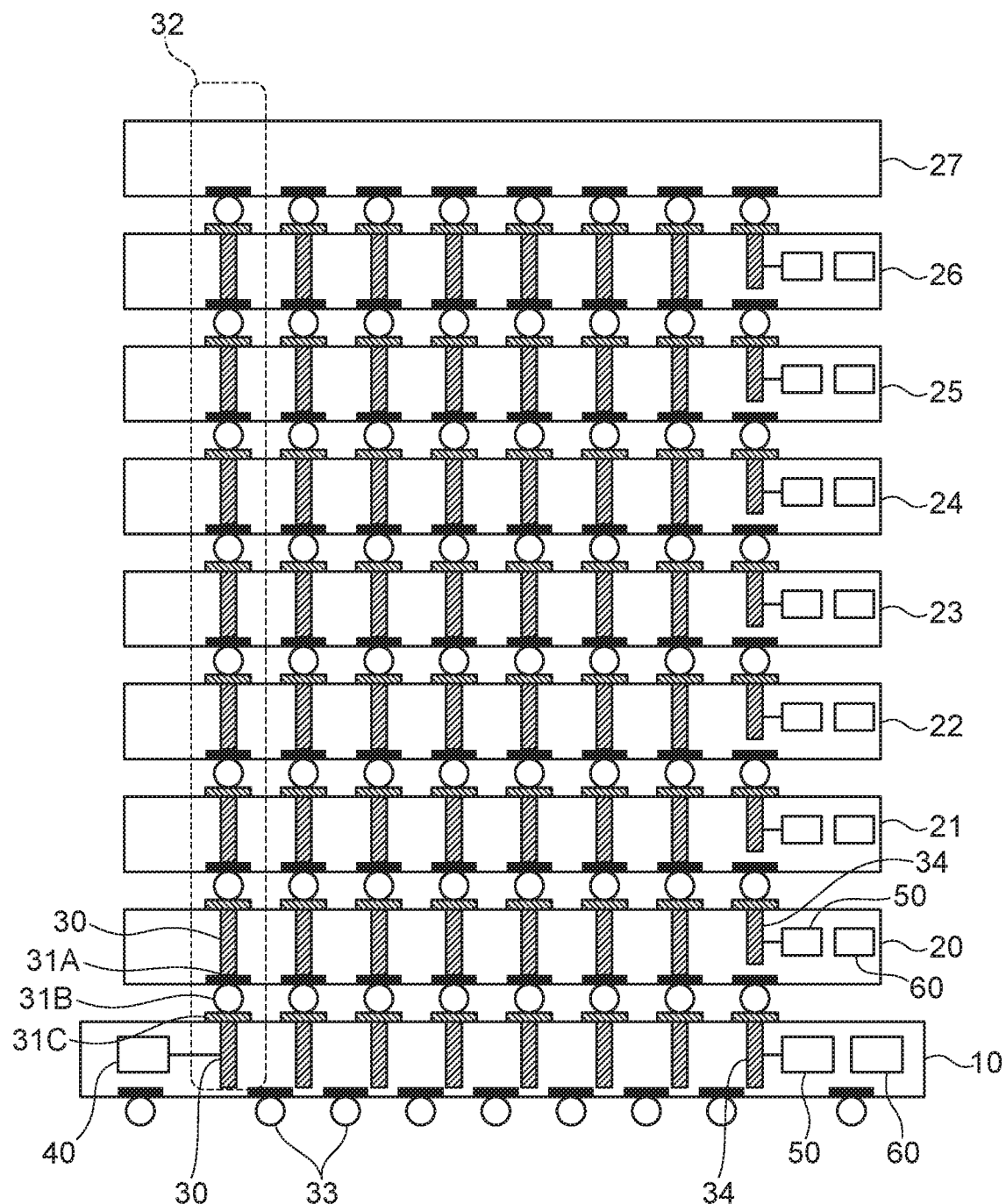
FIG. 1 is a schematic diagram showing a configuration of a semiconductor device according to the present application.

A semiconductor device shown in FIG. 1 is an HBM having a configuration in which eight memory core chips 20 to 27 are stacked on an interface chip 10. However, the semiconductor device to which the present invention is applicable is not limited to an HBM. The memory core chips 20 to 27 are each a semiconductor chip in which a memory core including a memory cell array is integrated. The interface chip 10 is a semiconductor chip that controls the memory core chips 20 to 27. The interface chip 10 and the memory core chips 20 to 26 each have a plurality of TSVs 30 that are provided to penetrate through a semiconductor substrate. All the interface chip 10 and the memory core chips 20 to 27 are stacked in a face-down manner, that is, in such a manner that a main surface with transistors and a wiring pattern (both not shown) formed thereon faces down. Therefore, no TSV 30 is required in the memory core chip 27 located in an uppermost layer. However, the memory core chip 27 located in the uppermost layer may have the TSV 30. Almost all the TSVs 30 provided in the memory core chips 20 to 26 are connected to front-surface TSV pads 31A located at the same plane positions, respectively. Meanwhile, most of the TSVs 30 provided in the interface chip 10 and most of the front-surface TSV pads 31A provided on the interface chip 10 are present at different plane positions from each other. Among the TSVs 30 provided in the interface chip 10 and the memory core chips 20 to 26, the TSVs 30 located at the same plane position are connected to each other in cascade connection via the front-surface TSV pad 31A, a TSV bump 31B, and a rear-surface TSV pad 31C. In this manner, a plurality of signal paths 32 are formed. A command and write data output fin the interface chip 10 are supplied to the memory core chips 20 to 27 via the signal paths 32. Read data output from the memory core chips 20 to 27 is supplied to the interface chip 10 via the signal paths 32. External terminals 33 are provided on the interface chip 10, via which signal transmission and reception to/from an external circuit are performed.

Some TSVs 34 are not coupled to the front pads 31A and accordingly are not coupled to TSVs 34 located at the same planar locations of other chips.

The interface chip 10 includes test circuits 40, 50, and 60 for measuring the parasitic capacitances of TSVs. The test circuit 40 is coupled to a TSV 30 constituting the signal path 32 and the test circuit 50 is coupled to TSVs 34 to which the microbump 31B is not allocated. In contrast thereto, the test circuit 60 is not coupled to any TSVs. The test circuits 50 and 60 are provided also in the memory core chips 20 to 26. The test circuits 40, 50, and 60 have a same circuit configuration.

Figure 2A:
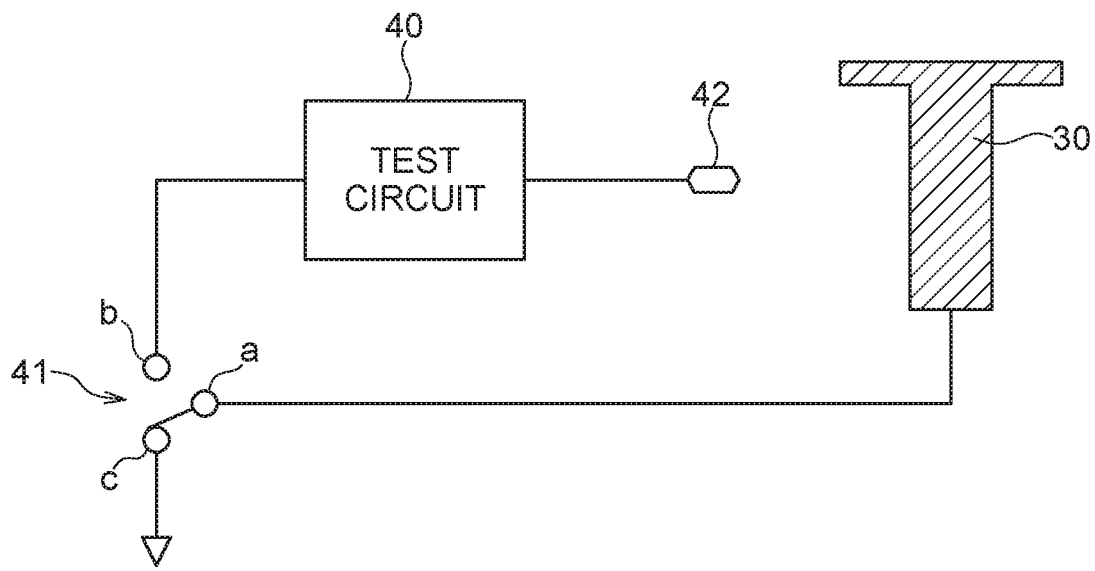
FIG. 2A is a circuit diagram for explaining a connecting relation between a test circuit and a TSV.
Figure 2B:
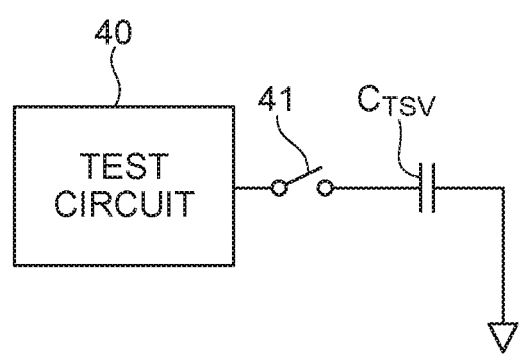
FIG. 2B is an equivalent circuit diagram of the circuit shown in FIG. 2A.

As shown in FIG. 2A, the test circuit 40 and the TSV 30 are coupled to each other via a switch circuit 41. The TSV 30 is made of a pillar-shaped conductor provided to penetrate the semiconductor substrate and has a capacitance component mainly with respect to the semiconductor substrate. The TSV 30 has a capacitance component also with respect to a power line and the like. Therefore, when the parasitic capacitance component of the TSV 30 is denoted by $C_{TSV}$, the circuit shown in FIG. 2A can be represented by an equivalent circuit shown in FIG. 2B. The switch circuit 41 has nodes a, b, and c and the node a is coupled to either one of the nodes b and c. The node a is coupled to the TSV 30, the node b is coupled to the test circuit 40, and the node c is coupled to the semiconductor substrate or a ground line. The switch circuit 41 is in an ON state when in a state in which the node a and the node b are coupled to each other and is in an OFF state when in a state in which the node a and the node c are coupled to each other. The test circuit 40 is coupled to a pad electrode 42. The pad electrode 42 is a terminal with which a probe of a tester is brought into contact in a test process for the semiconductor device according to the present embodiment. Therefore, the pad electrode 42 is larger in the planar size than the front pad 31A or the back pad 31C.

Figure 3:
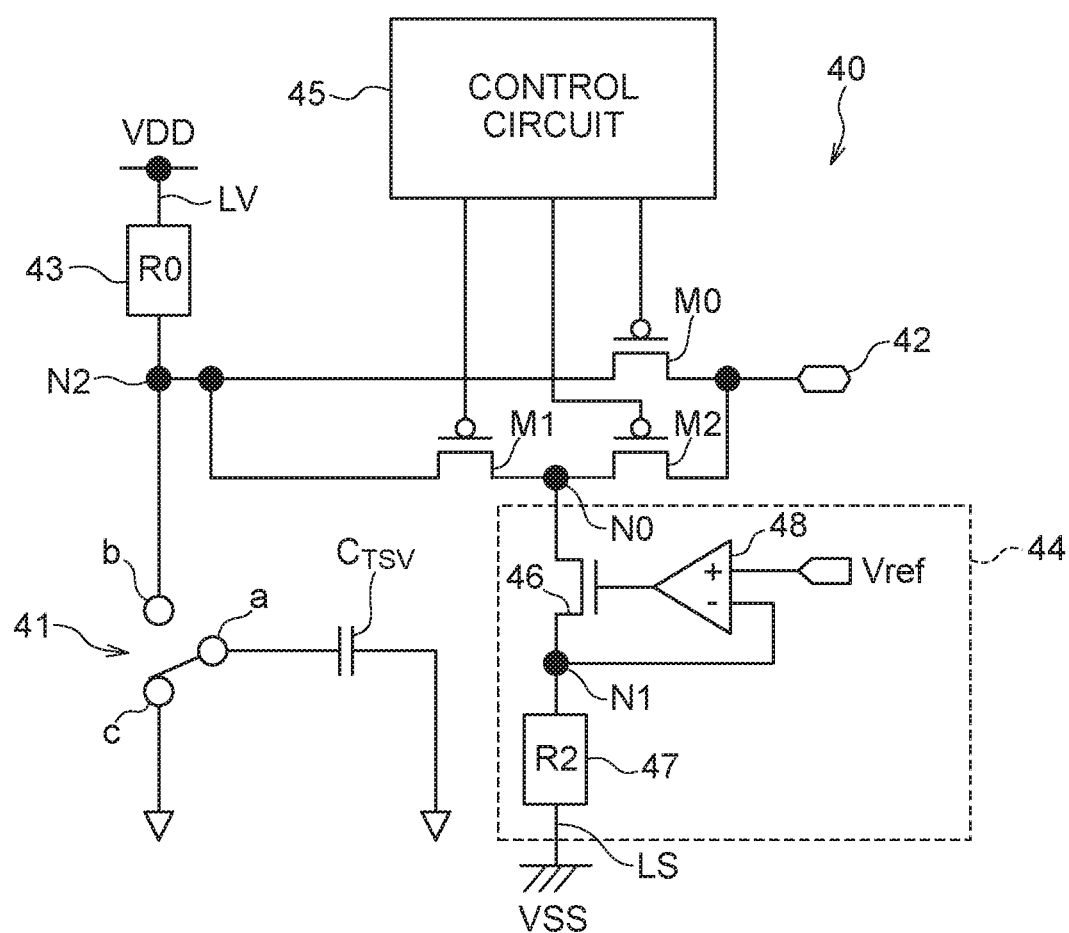
FIG. 3 is a circuit diagram of the test circuit.

FIG. 3 is a circuit diagram of the test circuit 40. As shown in FIG. 3, the test circuit 40 includes a reference resistor 43, a constant current source 44, a control circuit 45, and transistors M0 to M2 in addition to the switch circuit 41 and the pad electrode 42. The reference resistor 43 is, for example, made of a tungsten wire and is coupled between a power line LV that supplies a power-supply potential VDD and an internal node N2. The internal node N2 is coupled to the node b of the switch circuit 41. The resistance value of the reference resistor 43 is set to R0. The transistor M0 is coupled between the internal node N2 and the pad electrode 42. Similarly, the transistors M1 and M2 are coupled in series between the internal node N2 and the pad electrode 42. The transistors M0 to M2 are all P-channel MOS transistors although the present invention is not limited thereto. The operations of the transistors M0 to M2 are controlled by the control circuit 45. A coupling point between the transistor M1 and the transistor M2 constitutes an internal node N0.

The constant current source 44 is coupled between the internal node N0 and a power line LS supplying a power-supply potential VSS. The constant current source 44 includes a transistor 46 and a resistor 47 coupled in series between the internal node N0 and the power line LS, and an operational amplifier 48. An output node of the operational amplifier 48 is coupled to a gate electrode of the transistor 46, a reference potential Vref is supplied to a non-inverting input node (+) of the operational amplifier 48, and an inverting input node (−) of the operational amplifier 48 is coupled to an internal node N1. Accordingly, the potential of the internal node N1 substantially matches the reference potential Vref and a constant current represented by Vref/R2 flows through the transistor 46 when the resistance value of the resistor 47 is denoted by R2. However, because there is some characteristic variation in the operational amplifier 48, the potential of the internal node N1 sometimes does not completely match the reference potential Vref.

Measurement of the parasitic capacitance component Cm of the TSV 30 is performed by a first calibration operation, a second calibration operation, and a measurement operation. The first calibration operation is an operation to measure a constant current generated by the constant current source 44. The second calibration operation is an operation to measure the resistance value R0 of the reference resistor 43.

Figure 4A:
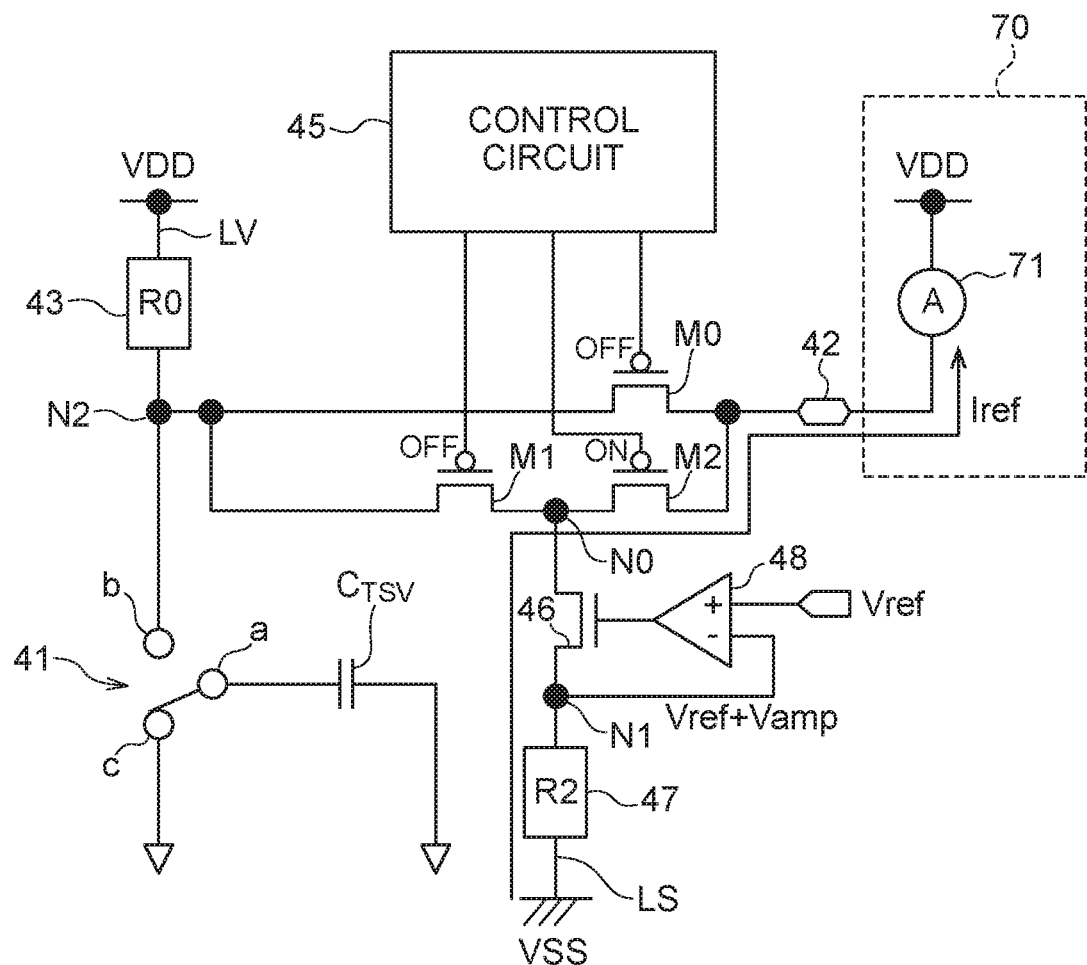
FIG. 4A is an explanatory diagram of a first calibration operation.

In the first calibration operation, the switch circuit 41 is turned off, and the control circuit 45 turns the transistors M0 and M1 off and the transistor M2 on as shown in FIG. 4A. Accordingly, the constant current source 44 is connected to the pad electrode 42 and the internal node N2 is disconnected from the pad electrode 42 and the constant current source 44. When the probe of a tester 70 is brought into contact with the pad electrode 42 in this state, a constant current Iref generated by the constant current 44 flows through the pad electrode 42. The amount of the constant current Iref flowing through the pad electrode 42 is measured by an ammeter 71 in the tester 70. Accordingly, the actual amount of the constant current Iref can be measured even when the potential of the internal node N1 is offset to a value being the reference potential Vref+Vamp due to the characteristic variation of the operational amplifier 48.

Figure 4B:
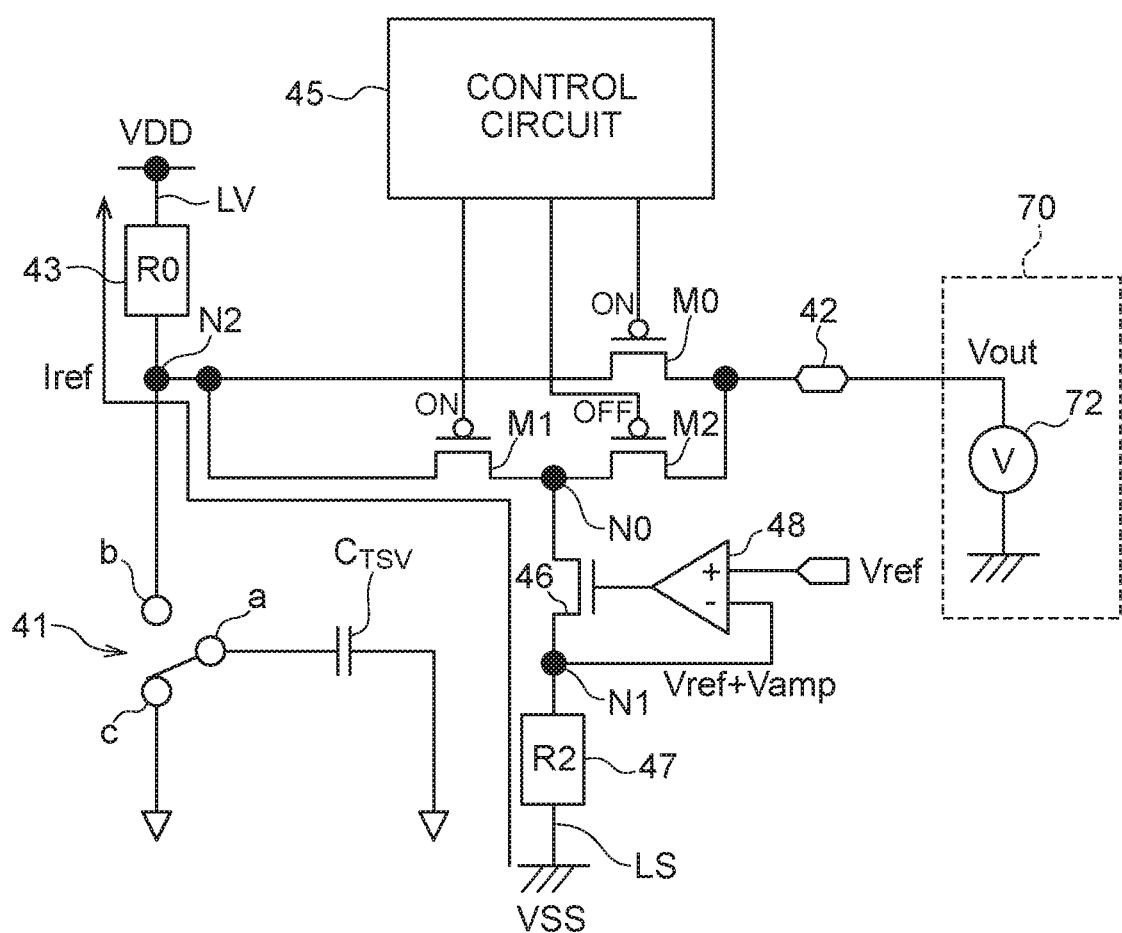
FIG. 4B is an explanatory diagram of a second calibration operation.

In the second calibration operation, the switch circuit 41 is turned off and the control circuit 45 turns the transistors M0 and M1 on and the transistor M2 off as shown in FIG. 4B. As shown by the first and second calibration operations (transistor M1 off and transistor M2 on for the first calibration operation; transistor M1 on and transistor M2 off for the second calibration operation), the transistors M1 and M2 are not on concurrently. That is, the transistors M1 and M2 are exclusively brought into an on state. With the transistors M0 and M1 on and the transistor M2 off, the constant current source 44 is connected to the internal node N2 and is disconnected from the pad electrode 42. As a result, the constant current Iref flows through the reference current source 43 and the level of the internal node N2 is determined by the level of the power-supply potential VDD, the resistance value R0 of the reference resistor 43, and the amount of the constant current Iref. When the probe of the tester 70 is brought into contact with the pad electrode 42 in this state, the level of an output voltage Vout appearing at the pad electrode 42 is measured by a voltmeter 72 in the tester 70. The level of the output voltage Vout is determined by $$Vout = VDD - R0 \cdot Iref.$$

Therefore, the resistance value R0 of the reference resistor 43 can be calculated by $$R0 = (VDD - Vout)/Iref.$$

Because the level of the power-supply potential VDD is known and the amount of the constant current Iref is already measured in the first calibration operation, measurement of the output voltage Vout in the second calibration operation enables the actual resistance value R0 of the reference resistor 43 to be accurately calculated.

Figure 4C:
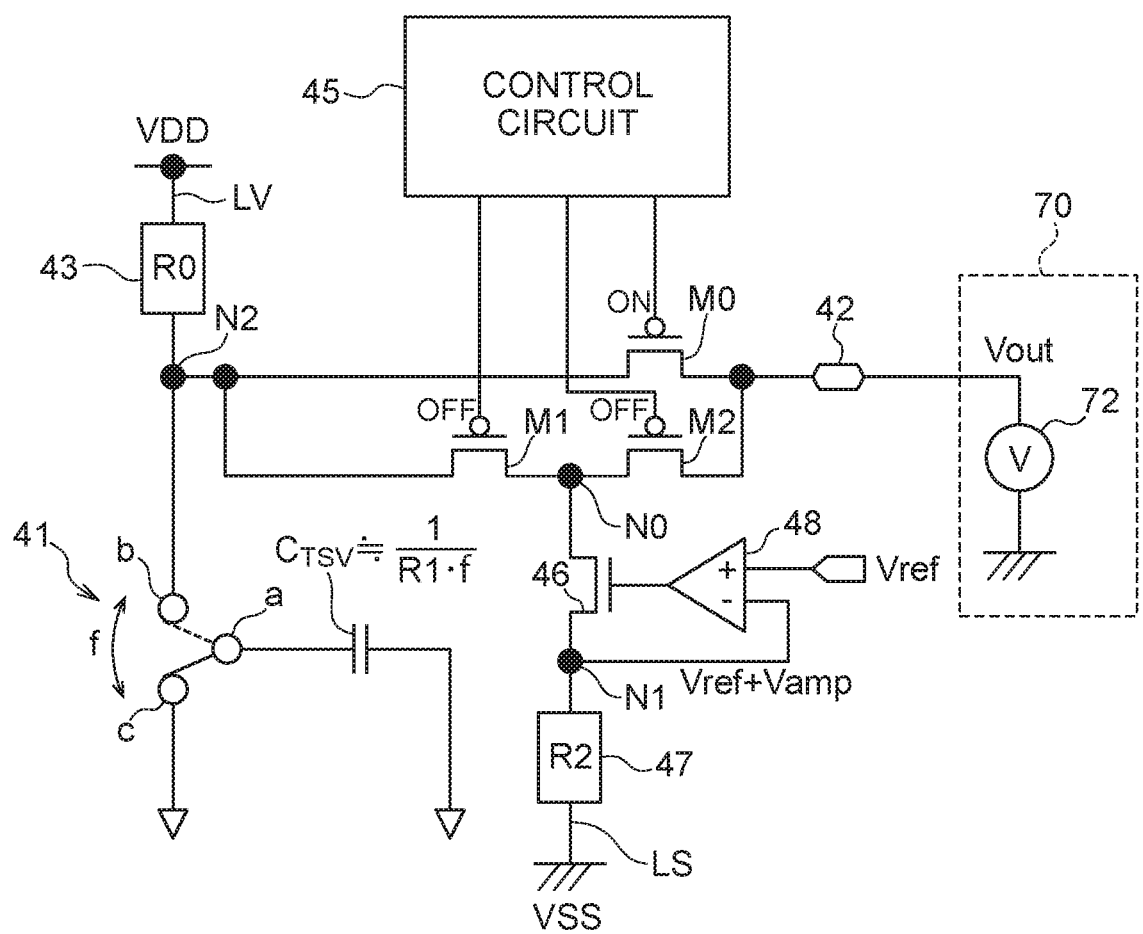
FIG. 4C is an explanatory diagram of a measurement operation.

In the measurement operation, the switch circuit 41 is turned on and off at a predetermined frequency f and the control circuit 45 turns the transistor M0 on and the transistors M1 and M2 off as shown in FIG. 4C. With this operation, the constant current source 44 is disconnected from the internal node N2 and the pad electrode 42, and the internal node N2 and the pad electrode 42 are connected to each other. With turning-on/off of the switch circuit 41 at the predetermined frequency f, the parasitic capacitance component $C_{TSV}$ of the TSV 30 can be approximated by an equivalent resistance R1. Therefore, the level of the output voltage Vout appearing at the pad electrode 42 is determined by the level of the power-supply potential VDD, the resistance value R0 of the reference resistor 43, and the equivalent resistance R1. When the probe of the tester 70 is brought into contact with the pad electrode 42 in this state, the level of the output voltage Vout appearing at the pad electrode 42 is measured by the voltmeter 72 in the tester 70. The output voltage Vout has a level determined by $$Vout = VDD(1 + R0 \cdot C_{TSV} \cdot f).$$

Therefore, the parasitic capacitance component $C_{TSV}$ of the TSV 30 can be calculated by $$C_{TSV} = (VDD - Vout)/(Vout \cdot R0 \cdot f).$$

Because the level of the power-supply potential VDD and the switching frequency f are known and the resistance value R0 of the reference resistor 43 is already measured in the second calibration operation, measurement of the output voltage Vout in the measurement operation enables the parasitic capacitance component $C_{TSV}$ of the TSV 30 to be accurately measured.

In this way, according to the present embodiment, even in a case in which there is manufacturing variation in the resistance value R0 of the reference resistor 43, the parasitic capacitance component $C_{TSV}$ of TSVs 30 can be accurately measured by bringing the probe of the tester 70 into contact with the single pad electrode 42 without using a plurality of pad electrodes 42. Therefore, when the test circuit 40 described above is mounted on the interface chip 10 shown in FIG. 1, the parasitic capacitance of the entire signal path 32 shown in FIG. 1 can be measured. When the test circuit 50 having an identical circuit configuration to that of the test circuit 40 described above is mounted on the interface chip 10 or the memory core chips 20 to 26 shown in FIG. 1, the parasitic capacitance of one layer of the TSVs 34 can be measured.

Figure 5:
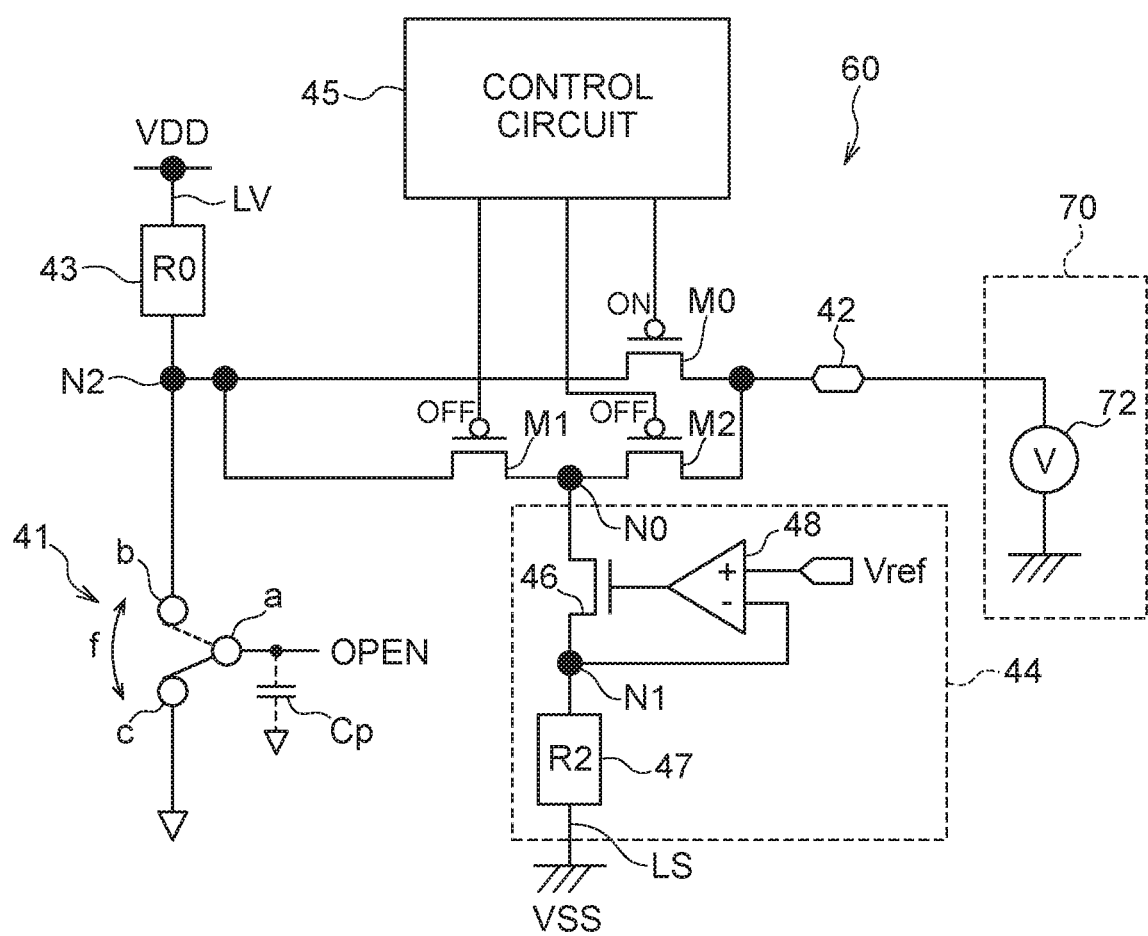
FIG. 5 is a circuit diagram of another test circuit.

Further, when the test circuit 60 shown in FIG. 5 is mounted on the interface chip 10 or the memory core chips 20 to 26 shown in FIG. 1, the parasitic capacitance of the test circuit 60 itself can be measured. The test circuit 60 shown in FIG. 5 is different from the test circuit 40 shown in FIG. 3 in that the node a of the switch circuit 41 is in an open state without being coupled to any TSV. A parasitic capacitance Cp of the node a is designed to have a same capacitance value as that of wires that couple the node a to the TSVs 30 or 34 in the test circuits 40 and 50. When the parasitic capacitance of the test circuit 40, 50, or 60 itself is measured using the test circuit 60 having the configuration described above and the value of the parasitic capacitance measured by the test circuit 60 is subtracted from the value of the parasitic capacitance measured by the test circuit 40 or 50, only the parasitic capacitance of a TSV as a measurement target can be more accurately measured without including the parasitic capacitance component of the test circuit 40, 50, or 60 itself.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a first semiconductor chip; and
a first TSV penetrating the first semiconductor chip, wherein the first semiconductor chip includes:
a first resistor coupled between a first power supply and a first node;
a switch circuit coupled between the first node and the first TSV;
a pad electrode operatively coupled to the first node; and
a constant current source operatively coupled to either one of the first node and the pad electrode.

2. The apparatus of claim 1, wherein the first semiconductor chip further includes a first transistor coupled between the first node and the constant current source.

3. The apparatus of claim 2,
wherein the first transistor is configured to be brought into an ON state and the switch circuit is configured to be brought into an OFF state during a first operation so that a calibration voltage appears at the pad electrode, and
wherein the first transistor is configured to be brought into an OFF state and the switch circuit is configured to be brought into an ON state and OFF state at a frequency during a second operation so that a measurement voltage appears at the pad electrode.

4. The apparatus of claim 3, wherein the first semiconductor chip further includes:
a second transistor coupled between the first node and the pad electrode; and
a third transistor coupled between a second node and the pad electrode, wherein the second node is between the first transistor and the constant current source.

5. The apparatus of claim 4, wherein the second and third transistors are configured to be brought into an ON state and an OFF state, respectively, during the first and second operations.

6. The apparatus of claim 5, wherein the first, second, and third transistors are configured to be brought into an OFF state, an OFF state, and an ON state, respectively, during a third operation so that a constant current flows at the pad electrode.

7. The apparatus of claim 4, wherein the constant current source includes:
a fourth transistor and a second resistor coupled in series between the second node and the second power line; and
an amplifier having an output node coupled to a control electrode of the fourth transistor, a first input node supplied with a reference potential, and a second input node coupled to a third node between the fourth transistor and the second resistor.

8. The apparatus of claim 1, further comprising:
a second semiconductor chip stacked on the first semiconductor chip; and
a second TSV penetrating the second semiconductor chip, wherein the first and second TSVs are coupled in series.

9. A method for measuring TSV capacitance, comprising:
providing a first electrical path between an external pad and a current source;
providing a second electrical path between a first voltage node and the current source including a resistor having a first node, the second electrical path coupling the current source with shutting off the first electrical path;
providing a third electrical path between the first node and the external pad during at least a part of time of providing the second electrical path; and
providing a fourth electrical path between the first voltage node and a second voltage node including the resistor and a TSV responsive to shutting off the first and second electrical paths and providing the third electrical path.

10. The method of claim 9, wherein the fourth electrical path includes a switch circuit coupled between the resistor and the TSV.

11. The method of claim 10, further comprising switching the switch circuit on and off at a predetermined frequency with providing the fourth electrical path.

12. The method of claim 11, further comprising measuring a potential of the external pad with providing the fourth electrical path.

13. The method of claim 10, wherein the switch circuit is configured to be brought into an OFF state with providing the first electrical path.

14. The method of claim 10, wherein the switch circuit is configured to be brought into an OFF state with providing the second electrical path.

15. The method of claim 9,
wherein the first electrical path includes a first transistor coupled between the external pad and the current source,
wherein the first transistor is brought into an ON state when providing the first electrical path, and
wherein the first transistor is brought into an OFF state when shutting off the first electrical path.

16. The method of claim 9,
wherein the second electrical path includes a second transistor coupled between the first voltage node and the current source, wherein the second transistor is brought into an ON state when providing the second electrical path, and wherein the second transistor is brought into an OFF state when shutting off the second electrical path.

17. The method of claim 9, wherein the third electrical path includes a third transistor coupled between the first node and the external pad, wherein the third transistor is brought into an ON state when providing the third electrical path, and wherein the third transistor is brought into an OFF state when shutting off the third electrical path.

18. An apparatus comprising:
a reference resistor;
a capacitive element;
a pad electrode;
a switch circuit coupled between the reference resistor and the capacitive element;
first and second transistors coupled in series between the pad electrode and a first node between the reference resistor and the switch circuit; and
a constant current source coupled to a second node between the first and second transistors, wherein the first and second transistors are configured to be exclusively brought into an ON state.

19. The apparatus of claim 18, further comprising a third transistor coupled between the pad electrode and the first node, wherein the third transistor is configured to be brought into an ON state in a measurement operation, and wherein the first and second transistor are configured to be brought into an OFF state in the measurement operation.

20. The apparatus of claim 19, wherein the first, second, and third transistors are configured to be brought into an OFF state, an ON state, and OFF state, respectively, in a first calibration operation, and wherein the first, second, and third transistors are configured to be brought into an ON state, an OFF state, and ON state, respectively, in a second calibration operation.

* * * * *